United States Patent
Ward et al.

(10) Patent No.: US 8,756,484 B1
(45) Date of Patent: Jun. 17, 2014

(54) DESIGN, DECODING AND OPTIMIZED IMPLEMENTATION OF SECDED CODES OVER GF(Q)

(71) Applicants: Sandia Corporation, Albuquerque, NM (US); Micron Technology, Inc., Boise, ID (US)

(72) Inventors: H. Lee Ward, Albuquerque, NM (US); Anand Ganti, Albuquerque, NM (US); David R. Resnick, Tucson, AZ (US)

(73) Assignees: Sandia Corporation, Albuquerque, NM (US); Micron Technology, Inc., Boise, ID (US)

( * ) Notice: Subject to any disclaimer, the term of this patent is extended or adjusted under 35 U.S.C. 154(b) by 0 days.

(21) Appl. No.: 14/029,379

(22) Filed: Sep. 17, 2013

Related U.S. Application Data (62) Division of application No. 13/116,976, filed on May 26, 2011, now Pat. No. 8,566,684.

(51) Int. Cl.
*G06F 11/00* (2006.01)

(52) U.S. Cl.
USPC .......................................... 714/801; 714/804

(58) Field of Classification Search
USPC ........... 375/350, 296; 370/252; 714/780, 781, 714/796, 758, 777, 752, 801, 804
See application file for complete search history.

(56) References Cited

U.S. PATENT DOCUMENTS

| | | | |
|---|---|---|---|
| 7,760,828 B2 * | 7/2010 | Visoz et al. | 375/350 |
| 7,774,678 B2 * | 8/2010 | Choi et al. | 714/758 |
| 8,127,209 B1 * | 2/2012 | Zhang et al. | 714/780 |
| 8,171,374 B2 * | 5/2012 | Miyazaki | 714/758 |
| 8,325,850 B2 * | 12/2012 | Zheng et al. | 375/296 |
| 8,374,098 B2 * | 2/2013 | Wezelenburg et al. | 370/252 |
| 2011/0138255 A1 * | 6/2011 | Lee | 714/777 |
| 2012/0240001 A1 * | 9/2012 | Abu-Surra et al. | 714/752 |
| 2013/0055050 A1 * | 2/2013 | Uchikawa | 714/781 |

* cited by examiner

*Primary Examiner* — David Ton
(74) *Attorney, Agent, or Firm* — Scott B. Stahl (57) ABSTRACT

A plurality of columns for a check matrix that implements a distance d linear error correcting code are populated by providing a set of vectors from which to populate the columns, and applying to the set of vectors a filter operation that reduces the set by eliminating therefrom all vectors that would, if used to populate the columns, prevent the check matrix from satisfying a column-wise linear independence requirement associated with check matrices of distance d linear codes. One of the vectors from the reduced set may then be selected to populate one of the columns. The filtering and selecting repeats iteratively until either all of the columns are populated or the number of currently unpopulated columns exceeds the number of vectors in the reduced set. Columns for the check matrix may be processed to reduce the amount of logic needed to implement the check matrix in circuit logic.

4 Claims, 6 Drawing Sheets

DESIGN, DECODING AND OPTIMIZED IMPLEMENTATION OF SECDED CODES OVER GF(Q)

CROSS-REFERENCE TO RELATED APPLICATION

This application is a divisional application of U.S. Non-Provisional application Ser. No. 13/116,976, Design, Decoding and Optimized Implementation of SECDED Codes over GF(q), by H. Lee Ward et al., filed May 26, 2011 (allowed Jun. 21, 2013), which is incorporated herein by reference.

STATEMENT OF GOVERNMENT INTEREST

This invention was developed under Contract DE-AC04-94AL85000 between Sandia Corporation and the U.S. Department of Energy. The U.S. Government has certain rights in this invention.

FIELD OF THE INVENTION

The present work relates generally to linear block codes and, more particularly, to single error correcting, double error detecting (SECDED) codes over GF(q).

BACKGROUND

SECDED codes play a pivotal role in data transfer/communication applications. One example is data storage applications. Advances in memory technology have provided the capability of storing increasingly large amounts of data in individual memory packages (or modules). This makes it possible to store/retrieve from a single memory module data that previously was stored/retrieved by accessing multiple modules, providing improvements in performance, power consumption, and scalability. When accessing a single module, it is advantageous to address effectively errors that have a single cause. For example, if several I/O terminals of a module provide respective I/O paths, a failed transmitter driving one of the terminals may be used multiple times per memory access. The bits transferred via any given terminal in a single burst may be considered to be a data symbol. If the terminal transfers data in 4-bit bursts, for example, then the symbol size is four bits. A sixteen-byte transfer might be accomplished by transferring a 4-bit burst (i.e., one symbol) on each of 32 terminals of the memory module. Within knowable limits, a SECDED code that appends four parity check symbols of four bits each is capable of correcting any error in a single data symbol (and detecting errors in two data symbols). Thus, errors repeatedly caused by a single failed transmitter associated with a single terminal may be corrected.

The aforementioned example SECDED code has a Hamming distance of at least four, in terms of symbols. This is a specific example of a linear $[n, k, d]_q$ code over a general alphabet GF(q), with n=36 (data+parity check) symbols, k=32 data symbols, code distance d=4, and symbol alphabet size q=16 ($2^4$ with 4 bits/symbol), that is, a $[36, 32, 4]_{16}$ code.

One approach to construct an $[n, k, d]_q$ code is a random search of parity check matrices in GF(q). Considering the aforementioned example of a $[36, 32, 4]_{16}$ code, there are 15 x 36 different single symbol errors, while the syndrome from the four symbol parity has 65536 possibilities. It thus appears that a random search would likely yield a code. Nevertheless, testing as many as 15 x $2^{30}$ H matrices obtained via random search has failed to yield a $[36, 32, 4]_{16}$ code.

Another approach is to construct a $[35, 32, 3]_{16}$ code, and extend it with a single parity check to a $[36, 32, 4]_{16}$ code. Since GCD(35,16)=1, construction of a BCH code with n=35 and d=3 may be considered. BCH codes provide a minimum distance guarantee that is determined by the generator polynomial. However, investigation of BCH codes with n=35 and q=16 reveals that the most efficient BCH codes with d=3 are $[35, 31, 3]_{16}$ codes, which cannot be extended to a $[36, 32, 4]_{16}$ code.

Another approach is the use of an existing bound, such as the Gilbert-Varshamov (GV) bound, that indicates feasible codes. However, for the code distance d=4, the GV bound indicates that only k=27.5 is achievable.

Another approach is constructing a $[36, 32, 4]_{16}$ code as four simultaneous $[36, 32, 4]_2$ codes, or two simultaneous $[36, 32, 4]_4$ codes. However, a $[36, 32, 4]_2$ code does not exist because it violates the Hamming bound. Although a linear $[36, 32, 4]_4$ code would not violate the Hamming bound, it has been found that $[36, 32, 4]_4$ codes do not exist.

It is desirable in view of the foregoing to provide for the construction of distance d linear codes more efficiently than by random searching.

DETAILED DESCRIPTION

The present work provides for non-deterministically generating the parity check matrix for a linear $[n, k, d]_q$ code over a general alphabet GF(q). The search space is organized as a tree, and the search can terminate in one of two states, one if it has taken an unsuccessful path and run out of search space, another if it has found a suitable parity check matrix. Also provided is a simple decoder for linear SECDED codes, with an efficient parallel implementation. The present work further provides for generating, from an input parity check matrix, another parity check matrix whose corresponding code has the same distance as that of the input matrix, is a subcode of the input matrix, and requires the minimum number of logical AND gates among all subcodes that encode the same set of symbols.

Figure 1:
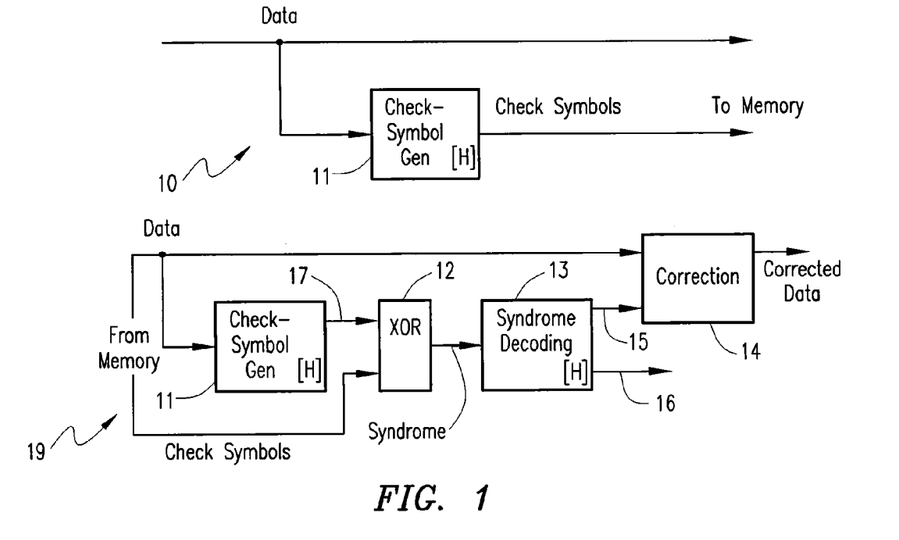
FIG. 1 diagrammatically illustrates a digital data storage system in accordance with example embodiments of the present work.

FIG. 1 diagrammatically illustrates a digital data storage (memory) system in accordance with example embodiments of the present work. Although a data storage system is used here as an expository example, it will be appreciated that the present work is generally applicable to any data transfer/communication application in which data may be corrupted between the input and output of a data transfer/communication channel. In FIG. 1, the data path for storage, shown at 10, includes a check symbol generator 11 that receives the data being stored, and uses the data, together with a suitable parity check matrix H, to produce parity check symbols for storage in memory with the data. In the data path for retrieval, shown at 19, the check symbol generator 11 uses the data retrieved from memory, together with the parity check matrix H, to produce parity check symbols at 17. In some embodiments, all instances of data are provided as 32 data symbols in parallel, with each symbol embodied as a 4-bit burst, and all instances of parity check symbols are provided as four symbols in parallel, each embodied as a 4-bit burst.

In the retrieval path 19, the parity check symbols at 17 are exclusive-ORed (XORed) at 12 with the parity check symbols that were stored (and are now retrieved) with the data symbols. The result of the XOR operation at 12 is the syndrome, which is decoded by a syndrome decoder 13. The syndrome decoder 13, which uses information from entries in the matrix H, produces information 15 which may be used by an error corrector, together with the retrieved data symbols, to correct single symbol errors and output correspondingly corrected data. The syndrome decoder 13 also produces information 16 which indicates detection of errors in two (and often more) symbols.

The above-described operations performed by the check symbol generator 11, the syndrome decoder 13 and the error corrector 14 are generally known in the art. Thus, in some embodiments, these components operate in accordance with conventional techniques. However, with respect to the parity check matrix H used by the check symbol generator 11 and the syndrome decoder 13, the present work provides improved techniques for non-deterministically generating this matrix H for a linear SECDED code. The present work exploits the known relationship between the code distance of a linear code and the requirement that there must be linear independence of the column vectors of the parity check matrix for the code. More specifically, if H is the parity check matrix of a linear code C, then the code C has distance d if and only if any non-trivial linear combination of d−1 column vectors of H is not zero. (Column vectors may also be referred to herein simply as columns, or vectors.) A parity check matrix H is described in standard form as $$H=[A_{r \times k} I_{r \times r}],$$

where A is a matrix describing the parity checks, I is the identity matrix concatenated with A to form H, k is the number of data symbols transferred, and r is the number of parity check symbols generated for the k data symbols. The aforementioned property that no non-trivial linear combination of d−1 column vectors of H results in zero is referred to herein as "d−1 linear independence", and the columns of H are said to be "d−1 linearly independent."

Considering the aforementioned example using 4-bit symbols, this provides sixteen ($2^4$) available values for a symbol. That is, the size of the symbol alphabet, referred to herein as q, is q=16. As shown generally in FIG. 2, the present work provides an A matrix generator 20 that receives as input the aforementioned parameters q, d, r, and k, and produces a matrix A in such a manner that A, and thus H, exhibits the aforementioned d−1 linear independence property. The parameters d and r are related as d≤r+1 to avoid violation of the singleton bound. The check symbol generator 11 of FIG. 1 uses information from the symbol entries in the matrix H to generate the check symbols, and the syndrome decoder 13 uses information from the symbol entries in matrix H to decode the syndrome.

Figure 3:
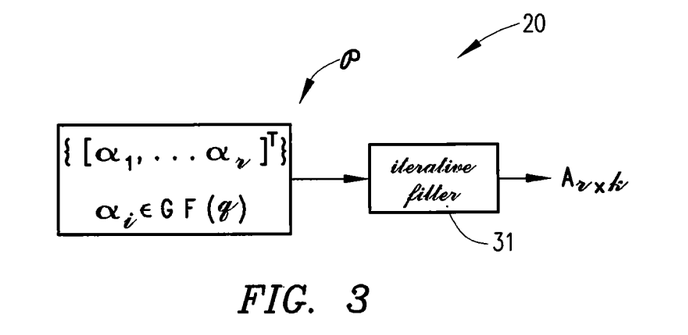
FIG. 3 diagrammatically illustrates the matrix generator of FIG. 2 in more detail according to example embodiments of the present work.

FIG. 3 diagrammatically illustrates further details of the A matrix generator 20 according to example embodiments of the present work. Noting that $A_{r \times k}$ has r rows, and with a symbol alphabet of size q, each column vector of A is a member of a set P that contains $q^r$ vectors. As shown in FIG. 3, each of these vectors contains r symbols, designated as $\alpha_1, \ldots, \alpha_r$. The set P would contain $16^4$ vectors in the aforementioned example using 4-bit symbols (q=16) and r=4 check symbols. As shown in FIG. 3, an iterative filter 31 is applied to the set P to generate the matrix A. During each iteration i, the filter 31 selects a column vector for the matrix A from a set $P_i$, which is a subset of P. The set $P_i$ was produced by filtering a set $P_{i-1}$ during the immediately preceding iteration i−1. Each $P_i$ is thus a subset of $P_{i-1}$. The filtering of $P_{i-1}$ to obtain $P_i$ is implemented by eliminating vectors from $P_{i-1}$ until the resulting set ($P_i$) contains only vectors that, if concatenated with the vector(s) previously selected to columnwise populate A, will maintain the aforementioned d−1 linear independence property required for the matrix H. Also during iteration i, the aforementioned vector elimination filtering is applied to set $P_i$, thereby producing a set $P_{i+1}$. During iteration i+1, the filter 31 selects the next column vector for A from $P_{i+1}$, and applies vector elimination filtering to $P_{i+1}$ to produce a set $P_{i+2}$, and so on.

Figure 4:
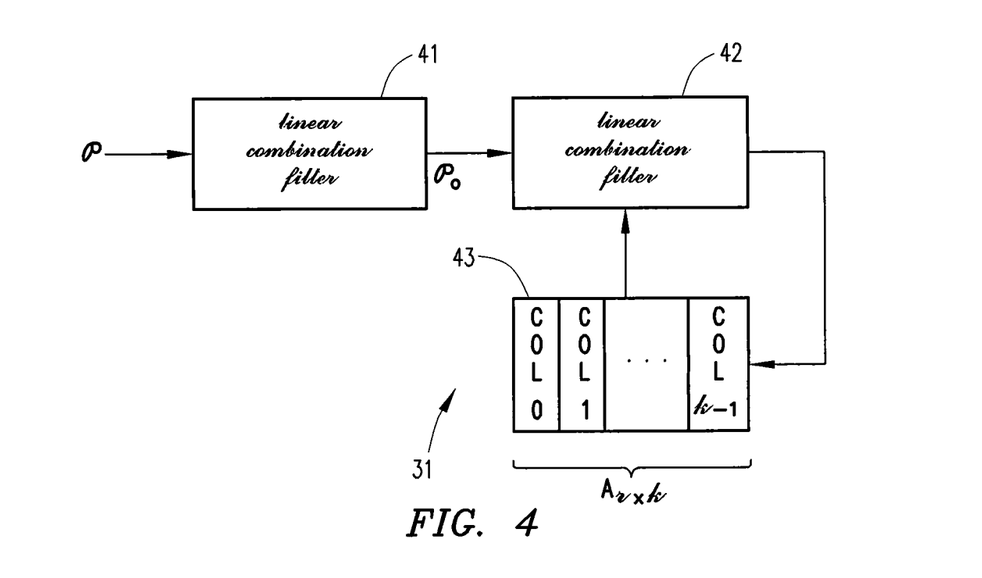
FIG. 4 diagrammatically illustrates the iterative filter of FIG. 3 in more detail according to example embodiments of the present work.

The iterative filter 31 is shown in more detail in FIG. 4. The filter 31 includes a first linear combination filter 41, a second linear combination filter 42, and a concatenation buffer 43 coupled for bidirectional communication with the second linear combination filter 42. The first linear combination filter 41 is an initializing filter that performs an initial vector elimination operation with respect to P, to produce an initial subset of P, namely $P_0$. The second linear combination filter 42 performs iterative filtering operations, beginning with the initial $P_0$ result produced by the first linear combination filter 41. For each iteration i that it performs (i=0, 1, 2, ...), the filter 42 selects from $P_i$ (the current subset of P) a column vector for A, and applies the aforementioned vector elimination processing to $P_i$ to produce from $P_i$ a set $P_{i+1}$ for the next iteration, i+1. The vector selected from $P_0$ (when i=0) is stored in the column 0 (COL 0) entry of the concatenation buffer 43, the vector selected from $P_1$ (when i=1) is stored in the column 1 (COL 1) entry, and so on. The concatenation buffer 43 is used in this fashion to construct the A matrix by successive concatenation of its columns.

Figure 5:
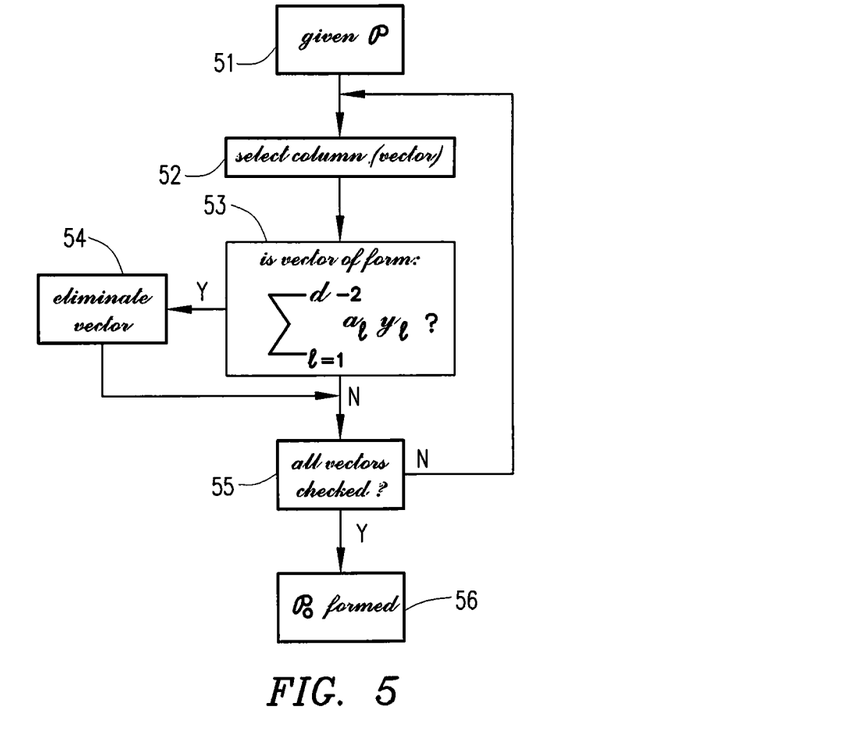
FIG. 5 illustrates initialization filtering operations that may be performed during check matrix generation according to example embodiments of the present work.

FIG. 5 illustrates example operations that may be performed according to the present work. In some embodiments, the first linear combination filter 41 of FIG. 4 performs the operations of FIG. 5. Given at 51 the set P, a first vector is selected from P at 52, and the test shown at 53 is applied to the selected vector. The test 53 is whether the selected vector is of the form $$\sum_{l=1}^{d-2} a_l y_l,$$

where $\alpha_l$ represents any of the q symbols in the symbol alphabet, and $y_l$ represents any column of I. If the selected vector is not of the form defined by the test at 53 (i.e., satisfies d−1 linear independence), then the vector passes the test, and operations proceed to 55. If the selected vector is of the form defined by the test at 53 (i.e., does not satisfy d−1 linear independence), then the vector fails the test, and is eliminated from P at 54, after which operations proceed to 55. As indicated at 55, the above-described operations are repeated until all vectors of P have been tested at 53, and eliminated at 54 as appropriate. After all vectors of P have been tested, the set $P_0$ is formed at 56 as the set of vectors that have not been eliminated from P.

Noting that a column vector is d−1 linearly dependent with columns of I if and only if that vector has at least d−2 zeros, some embodiments form the set $P_0$ by simply eliminating from P all vectors that contain at least d−2 zeros. Consider, for example, the aforementioned scenario where each element of each column vector contains four bits. Each column vector wherein all four bits of at least d−2 elements are zero is eliminated from P, and the result is $P_0$.

Figure 6:
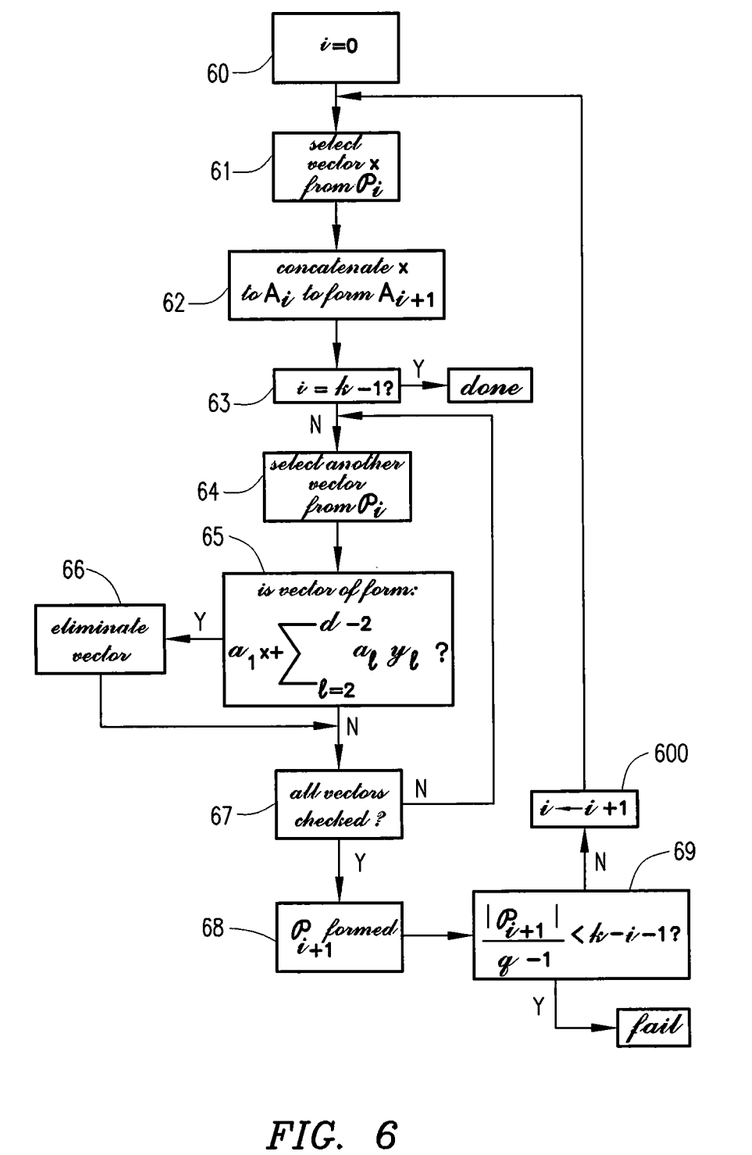
FIG. 6 illustrates iterative filtering operations that may be performed during check matrix generation according to example embodiments of the present work.

FIG. 6 illustrates example operations that may be performed according to the present work. In some embodiments, the second linear combination filter 42 and the concatenation buffer 43 (see FIG. 4) cooperate to perform the operations of FIG. 6. The iteration counter i is initially set to 0 at 60. A vector x is selected (e.g., at random) from $P_i$, the subset of P associated with the current iteration i. Note that the first $P_i$ at 61 in FIG. 6 (for i=0) is the set $P_0$ produced, for example, by the operations of FIG. 5. Because of the vector elimination filtering performed during the formation of $P_0$ (e.g., at 52-55 in FIG. 5), the selected vector x will satisfy the aforementioned requirement of d−1 linear independence. At 62, the vector x is assigned as a column of the A matrix that is being constructed. This may be conceptualized as concatenating x to a partially constructed matrix A. The partially constructed matrix to which x is concatenated is designated as $A_i$ at 62, and the result of the concatenation is designated as $A_{i+1}$. (See also, for example, the corresponding sequential storing of column vectors in the concatenation buffer 43 of FIG. 4.) Note that during iteration 0 (i=0), $A_i$ is $A_0$, where $A_0$ is the empty matrix. It can therefore be seen that the matrix A is constructed column-by-column as operations iterate.

At 63, if the iteration index i=k−1, then all columns of A have been populated, and the matrix is complete. Otherwise, another vector is selected from $P_i$ at 64. The test shown at 65 is applied to the selected vector. The test 65 is whether the selected vector is of the form $$a_1 x + \sum_{l=2}^{d-2} a_l y_l,$$

where $\alpha_1$ represents any of the q symbols in the symbol alphabet, $\alpha_l$ represents any of the q symbols in the symbol alphabet, and $y_l$ represents any column of I or $A_i$. If the selected vector is not of the form defined by the test at 65 (i.e., satisfies d−1 linear independence), then the vector passes the test, and operations proceed to 67. If the selected vector is of the form defined by the test at 65 (i.e., does not satisfy d−1 linear independence), then the vector fails the test, and is eliminated from $P_i$ at 66, after which operations proceed to 67. As indicated at 67, the operations described above at 64-66 are repeated until all vectors of $P_i$ have been tested at 65, and eliminated as appropriate at 66. After all vectors of $P_i$ have been tested, the set $P_{i+1}$ is formed at 68 as the set of vectors that have not been eliminated from $P_i$.

Thereafter, a test is performed at 69 to determine whether $P_{i+1}$ contains enough vectors to populate the currently unpopulated columns of A. In the test 69, $|P_{i+1}|$ denotes the number of vectors in $P_{i+1}$, and q is the size of the symbol alphabet. For each vector x that is yet to be concatenated to A at 62, at least the q−1 non-zero multiples of that vector will be eliminated at 66, so the maximum number of vectors still available for concatenation to A is bounded by $|P_{i+1}|/q-1$. There are at this point i+1 columns already populated in A, with k−i−1 columns remaining to be populated. The test 69 determines whether the maximum number of available vectors is less than the number of unpopulated columns of A. If not, then the iteration index is updated at 600, and operations return to 61 to begin the next iteration. Otherwise, the test 69 determines that there are not enough vectors in $P_{i+1}$ to complete the construction of A, so the current attempt to generate A fails.

The operations shown in FIG. 6 constitute only expository examples of how $P_{i+1}$ may be formed from $P_i$. Various embodiments use various techniques. For example, in some embodiments, the technique used to form $P_{i+1}$ from $P_i$ is tailored to the size of the code and the data processing resources available. Some embodiments use a hash table to represent all $q^r$ available vectors, with each vector indexing an entry in the table. The entries are in binary format, and are all initially set to the same binary value (e.g., 1). Elimination of a vector is represented by setting the corresponding entry to the other binary value (e.g., 0). For a given vector x, all vectors having the form specified at 65 in FIG. 6 are computed, and these computed vectors are used to index the hash table in parallel and write 0s to the corresponding entries, thereby forming $P_{i+1}$. The next vector x is selected from only those vectors whose corresponding table entry is 1.

In contrast to the above-described techniques of the present work, conventional approaches use a random code search when attempting to find an $[n, k, d]_q$ code that is not a member of the currently known block codes or their modifications. The smaller the ratio of the total number of check matrices for $[n, k, d]_q$ codes to the total number of k x r matrices, the less likely is the success of a random search technique. The present work provides a more systematic search for check matrices and is significantly more efficient than a random search in finding $[n, k, d]_q$ codes if these codes are rare. Although the time needed to verify the d−1 linear independence of a column increases with successive iterations in the present work, the number of acceptable columns decreases with successive iterations. This makes it progressively more likely to choose columns that are acceptable as the time needed to verify column acceptability progressively increases. Also, because candidate columns may be identified as not acceptable while the matrix is being built, the present work determines relatively early if a matrix under construction will not work.

As an example, a random brute force search, using fifteen 2.27 GHz, 8 GByte processors for two weeks, has failed to produce a linear $[36, 32, 4]_{16}$ code. (Relaxing the check symbol requirement to r=5, or the distance requirement to d=3, has been found to enable random brute force searching to produce the respectively associated $[37, 32, 4]_{16}$ and $[36, 32, 3]_{16}$ codes in about an hour.) In contrast, the techniques of the present work have produced a linear $[36, 32, 4]_{16}$ code in under a minute using a single processor. A linear $[68, 64, 4]_{16}$ code has also been produced according to the present work.

In some embodiments, the syndrome decoder 13 in FIG. 1 implements a simple decoding technique for linear SECDED codes that allows for a parallel implementation. The decoding technique (which may be generalized for use with larger distance codes) is based on the fact that the syndrome resulting from 12 (also FIG. 1), designated as s, is a linear combination of columns of H. That is, if h(i), i=1, . . . , n are the columns of H (where n=k+r), and e=[$e_1$, . . . , $e_n$]$^T$ is the error vector, then $$s = He = \sum_{i=1}^{n} e_i h(i)$$

For a SECDED code, only errors that have Hamming weights 0, 1, and 2 need to be distinguished. This forms the essence of the decoding technique. The following relationships among s, e, and h(i) may be written:

$$h(i)|s \text{ iff } \exists e \in GF(q) : s = eh(i).$$

Figure 7:
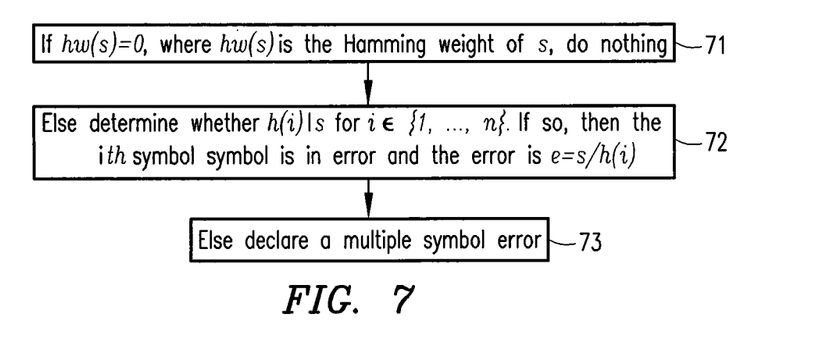
FIG. 7 illustrates operations that may be performed during syndrome decoding according to example embodiments of the present work.

If h(i)|s and s≠0, then e=s/h(i) is well defined. Accordingly, as shown at 71-73 in FIG. 7, decoding is performed as follows in some embodiments:

If hw(s)=0, where hw(s) is the Hamming weight of s, do nothing;
Else determine whether h(i)|s for i∈{1, . . . , n}. If so, then the ith symbol is in error and the error is e=s/h(i);
Else declare a multiple symbol error.

Figure 8:
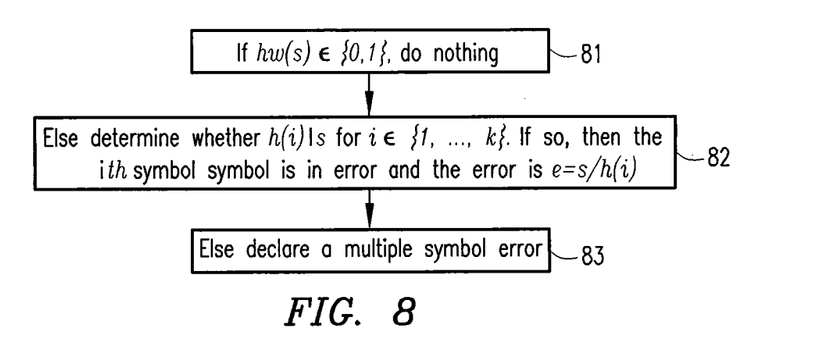
FIG. 8 illustrates operations that may be performed during syndrome decoding according to further example embodiments of the present work.

Some embodiments achieve improved computational efficiency by assuming that H is in standard form, H=[$A_{r \times k}$ $I_{r \times r}$], and that errors in the parity check symbols will not be corrected. As shown at 81-83 in FIG. 8, decoding under these assumptions is performed as follows:

If hw(s)∈{0,1}, do nothing;
Else determine whether h(i)|s for i∈{1, . . . , k}. If so, then the ith symbol is in error and the error is e=s/h(i);
Else declare a multiple symbol error.

Given s, h∈GF(q)$^r$, evaluating whether the condition h(i)|s is satisfied is equivalent to satisfying the following conditions, where i and j are symbol indices of the syndrome s and the column h(i)

$$h_j = 0 \Rightarrow s_j = 0, \forall j$$

and $$\forall i,j : h_i, h_j \neq 0 \text{ require } (h_i)^{-1} s_i = (h_j)^{-1} s_j$$

For purposes of evaluating the foregoing conditions, the multiplicative inverses of the possible non-zero symbol values in H (e.g., ($h_i$)$^{-1}$ and ($h_j$)$^{-1}$) may be pre-computed. For example, in the aforementioned case of 4-bit symbols, each symbol value of each column may be represented as a single hexadecimal digit. The respective multiplicative inverses for the hexadecimal digits 1, 2, . . . , E, F are: 1 9 E D B 7 6 F 2 C 5 A 4 3 8.

Applying the conditions defined above to the symbols of an example column vector h=[4 F 0 3]$^T$ in a four-row (r=4) H matrix, it can be seen that the h(i)|s condition is satisfied for a given syndrome s if $$s_3 = 0$$

and $$4^{-1} s_1 = D s_1 = F^{-1} s_2 = 8 s_2 = 3^{-1} s_4 = E s_4$$

where $s_1$, $s_2$, $s_3$ and $s_4$ are the syndrome symbols.

Figure 11:
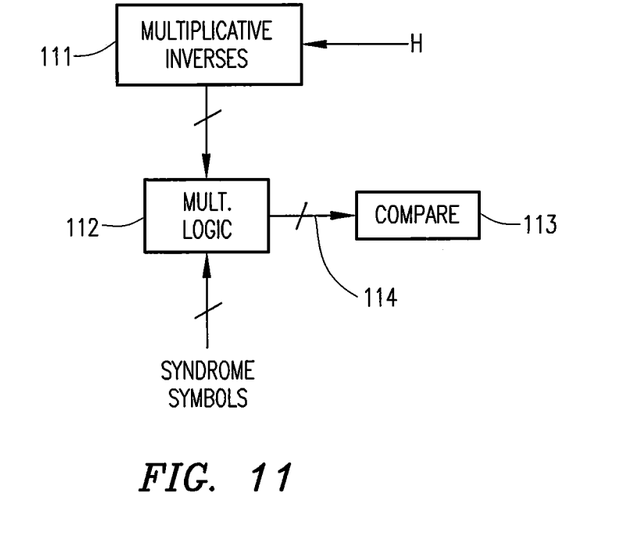
FIG. 11 diagrammatically illustrates a portion of the syndrome decoder of FIG. 1 according to example embodiments of the present work.

In some embodiments, pre-computed multiplicative inverses are stored, and the syndrome decoder 13 of FIG. 1 multiplies the appropriate multiplicative inverse values by the appropriate syndrome symbols in parallel to facilitate determining (e.g., at 71 in FIGS. 7 and 81 in FIG. 8) whether the h(i)|s condition is satisfied. FIG. 11 diagrammatically illustrates a corresponding portion of the syndrome decoder 13 according to example embodiments of the present work. The appropriate multiplicative inverses are provided in parallel from storage 111 based on the column content of the H matrix. Parallel multiplication logic 112 multiplies the appropriate stored inverses and the appropriate syndrome symbols in parallel, producing parallel results 114 that are compared at 113 (to determine whether the are equal) in support of the determination as to whether the h(i)|s condition is satisfied.

For a systematic [k+r, k, d]$_q$ linear code with parity check matrix in standard form H=[A|r], and input x=[$x_1$ . . . $x_k$], the check symbol generator 11 computes the parity check symbols as follows $$\begin{bmatrix} y_1 \\ \vdots \\ y_r \end{bmatrix} = \sum_{i=1}^{k} x_i h(i).$$

As is well known in the art, the addition operations in GF(2$^m$) computation may be implemented using XOR logic gates, and the multiplication operations may be implemented using XOR and AND logic gates. The weight of an element a∈GF(2$^m$), denoted as w(a), is defined as the sum of the Hamming weights of vector space representations a,a$^{-1}$. The weight of a matrix is the sum of the weights of its elements. The weight of H is directly proportional to the total number of AND gates required for both encoding and decoding. Example embodiments of the present work minimize the weight of H, thereby minimizing the total number of AND gates in the check symbol generator 11 and the syndrome decoder 13.

Some embodiments produce a check matrix $H_{(k_{max}+r) \times r}$ having r rows and $k_{max}+r$ columns, and then use that matrix to produce another check matrix $\tilde{H}_{(k+r) \times r}$ having r rows and k+r columns. The columns of $\tilde{H}_{(k+r) \times r}$ have the same degree of linear independence as the columns of $H_{(k_{max}+r) \times r}$ (i.e., both matrices have the same code distance). It may be assumed without loss of generality that the matrix $H_{(k_{max}+r) \times r}$ is in standard form. The matrix $\tilde{H}_{(k+r) \times r}$ is also in standard form. It is known in the art to form a matrix such as $\tilde{H}_{(k+r) \times r}$ by selecting its k+r columns from the $k_{max}+r$ columns of a matrix such as $H_{(k_{max}+r) \times r}$. However, example embodiments of the present work suitably process the columns of $H_{(k_{max}+r) \times r}$ to permit the columns of $\tilde{H}_{(k+r) \times r}$ to be selected such that $\tilde{H}_{(k+r) \times r}$ has the lowest weight among all k×r sub-matrices that could be chosen from $H_{(k_{max}+r) \times r}$ and have the same code distance as $H_{(k_{max}+r) \times r}$.

Figure 9:
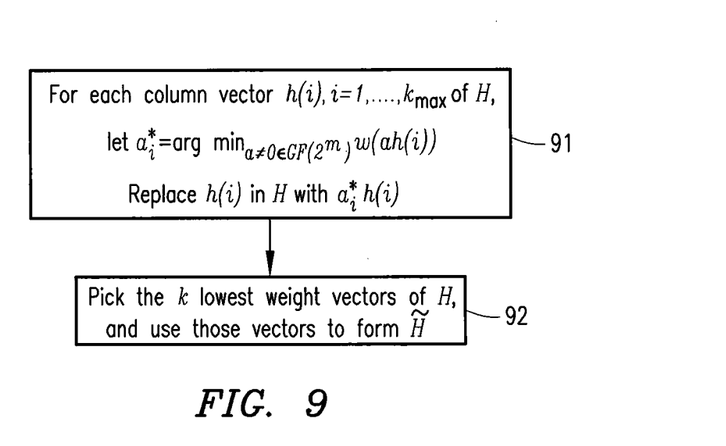
FIG. 9 illustrates operations that may be performed to produce a weight-optimized check matrix according to example embodiments of the present work.

As shown in FIG. 9, in some embodiments, the first k columns of $\tilde{H}_{(k+r) \times r}$ are determined based on $H_{(k_{max}+r) \times r}$ as follows:

At 91,
For each column vector h(i), i=1, . . . , $k_{max}$ of H,
let a*$_i$=arg min$_{a \neq 0 \in GF(2^m)}$ w(ah(i)).
Replace h(i) in H with a*$_i$h(i).

Thus, each column of H is effectively multiplied by a coefficient that minimizes the weight of (and thus maximizes the number of zeros in) that column. At 92, the k lowest weight vectors (columns) are selected from H, and the selected vectors are used to form $\tilde{H}$.

Figure 2:
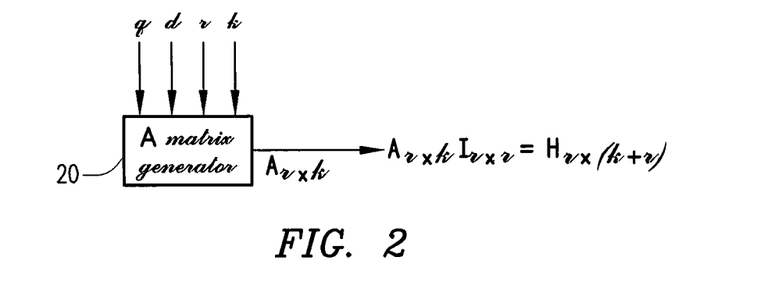
FIG. 2 diagrammatically illustrates a matrix generator for generating a matrix that describes parity checks for use in SECDED coding in the system of FIG. 1 according to example embodiments of the present work.
Figure 10:
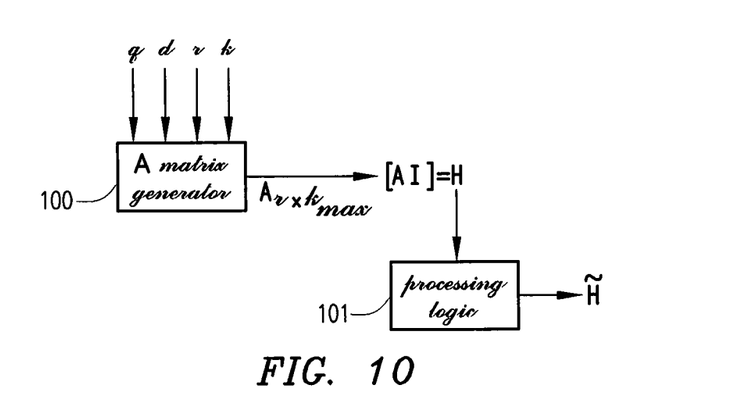
FIG. 10 diagrammatically illustrates a matrix generator apparatus for generating a matrix that describes parity checks for use in SECDED coding in the system of FIG. 1 according to further example embodiments of the present work.

In some embodiments, the matrix H used in the processing of FIG. 9 is produced by an A matrix generator (see 100 in FIG. 10) that is similar to the A matrix generator 20 of FIGS. 1-3, and generates the A matrix columns in the manner described relative to FIGS. 4-6. However, the A matrix generator 100 produces A with $k_{max}$ columns, and implements a corresponding concatenation buffer of width $k_{max}$ (not explicitly shown in FIG. 10), thereby permitting formation of the desired matrix $H_{(k_{max}+r) \times r}$. As also shown in FIG. 10, data processing logic 101 produces $\tilde{H}_{(k+r) \times r}$ from $H_{(k_{max}+r) \times r}$, for example, in the manner described relative to FIG. 9. The matrix $\tilde{H}_{(k+r) \times r}$ may then be used by the check symbol generator 11 and syndrome decoder 13 of FIG. 1.

Although example embodiments of the present work are described above in detail, this does not limit the scope of the present work, which can be practiced in a variety of embodiments.

What is claimed is:

1. A method of generating a check matrix that implements a linear code, comprising:
    generating a first check matrix that implements the code;
    processing content in at least one column of the first check matrix to increase a number of zeros contained in said at least one column, and thereafter selecting less than all columns of the first check matrix, wherein all of the columns that are selected respectively contain a number of zeros that is less than or equal to a number of zeros contained in any of the remainder of said columns; and
    providing the selected columns respectively as columns of a final check matrix that implements the code.

2. The method of claim 1, wherein said processing includes multiplying said content of said at least one column by an associated at least one multiplier.

3. An apparatus for generating a check matrix that implements a linear code, comprising:
    a matrix generator configured to generate a first check matrix that implements the code;
    processing logic coupled to said matrix generator and configured to process content in at least one column of the first check matrix to increase a number of zeros contained in said at least one column, and to thereafter select less than all columns of the first check matrix, wherein all of the columns that are selected respectively contain a number of zeros that is less than or equal to a number of zeros contained in any of the remainder of said columns; and
    an output coupled to said processing logic for providing the selected columns respectively as columns of a final check matrix that implements the code.

4. The apparatus of claim 3, wherein said processing logic is configured to multiply said content of said at least one column by an associated at least one multiplier.

* * * * *